(12) United States Patent
Kubota et al.

(10) Patent No.: US 10,586,599 B1
(45) Date of Patent: Mar. 10, 2020

(54) SEMICONDUCTOR STORAGE DEVICE

(71) Applicant: Toshiba Memory Corporation, Minato-ku (JP)

(72) Inventors: Kenro Kubota, Fujisawa (JP); Shouichi Ozaki, Komae (JP); Yasuhiro Suematsu, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/566,367

(22) Filed: Sep. 10, 2019

(30) Foreign Application Priority Data

Dec. 21, 2018 (JP) ................................. 2018-239994

(51) Int. Cl.
| | |
|---|---|
| *G11C 16/04* | (2006.01) |
| *G11C 16/10* | (2006.01) |
| *G11C 16/26* | (2006.01) |
| *G11C 16/08* | (2006.01) |
| *G11C 16/32* | (2006.01) |
| *G11C 16/30* | (2006.01) |

(52) U.S. Cl.
CPC .......... *G11C 16/10* (2013.01); *G11C 16/0483* (2013.01); *G11C 16/08* (2013.01); *G11C 16/26* (2013.01); *G11C 16/30* (2013.01); *G11C 16/32* (2013.01)

(58) Field of Classification Search
CPC ..... G11C 16/0483; G11C 16/08; G11C 16/10; G11C 16/26; G11C 16/30; G11C 16/32
See application file for complete search history.

(56) References Cited

U.S. PATENT DOCUMENTS

| | | | | |
|---|---|---|---|---|
| 6,981,089 | B2 * | 12/2005 | Dodd | G06F 13/4086 710/308 |
| 7,684,238 | B2 * | 3/2010 | Mo | G11C 11/5628 365/185.03 |
| 8,089,298 | B2 * | 1/2012 | Oh | G06F 13/4086 326/30 |
| 8,531,898 | B2 | 9/2013 | Seol et al. | |
| 9,030,888 | B2 | 5/2015 | Dono et al. | |
| 2003/0039151 | A1 * | 2/2003 | Matsui | G11C 7/1006 365/195 |

(Continued)

FOREIGN PATENT DOCUMENTS

| | | |
|---|---|---|
| JP | 2013-74564 A | 4/2013 |
| JP | 2014-146641 A | 8/2014 |

*Primary Examiner* — Alexander H Taningco
*Assistant Examiner* — Kurtis R Bahr
(74) *Attorney, Agent, or Firm* — Oblon, McClelland, Maier & Neustadt, L.L.P.

(57) ABSTRACT

A semiconductor storage device in an embodiment includes a memory cell array, a pad to which data is inputted, an ODT circuit connected to the pad, an ODT driver configured to drive the ODT circuit, and a control circuit configured to supply an enable signal and a resistance value control signal to the ODT driver. The pad is arranged between the memory cell array and a first end side of the semiconductor storage device, and the ODT circuit is arranged between the pad and the first end side. The ODT driver is arranged between the ODT circuit and the first end side. An ODT control signal line configured to transmit a resistance value control signal, and an ODT enable signal line configured to transmit an enable signal are arranged between the ODT driver and the first end side.

13 Claims, 9 Drawing Sheets

(56) References Cited

U.S. PATENT DOCUMENTS

| | | | |
|---|---|---|---|
| 2005/0212551 A1* | 9/2005 | So | G11C 5/04 326/30 |
| 2009/0303802 A1* | 12/2009 | Lee | G11C 5/04 365/189.05 |
| 2011/0057720 A1* | 3/2011 | Komyo | H03K 19/0005 327/551 |
| 2017/0178750 A1* | 6/2017 | Kang | G11C 11/4074 |
| 2017/0357581 A1* | 12/2017 | Yanagidaira | G06F 13/16 |

* cited by examiner

SEMICONDUCTOR STORAGE DEVICE

CROSS-REFERENCE TO RELATED APPLICATIONS

This application is based upon and claims the benefit of priority from the prior Japanese Patent Application No. 2018-239994 filed on Dec. 21, 2018; the entire contents of which are incorporated herein by reference.

FIELD

Embodiments described herein relate generally to a semiconductor storage device.

BACKGROUND

A NAND flash memory is known as a semiconductor storage device.

DETAILED DESCRIPTION

A semiconductor storage device in the present embodiment includes a memory cell array in which a plurality of memory cells are aligned, a pad to which data written to the memory cell array is inputted, a terminator circuit connected to the pad, a drive circuit configured to be selectively brought into an enable state or a disable state based on an enable signal, and to drive the terminator circuit to a predetermined resistance value based on a resistance value control signal when the drive circuit is being brought into the enable state based on the enable signal, and a control circuit configured to supply the enable signal and the resistance value control signal to the drive circuit. The semiconductor storage device has a first end side and a second end side extending in a first direction, and a third end side and a fourth end side extending in a second direction orthogonal to the first direction. In the second direction, the pad is arranged between the memory cell array and the first end side. In the second direction, the terminator circuit is arranged between the pad and the first end side. In the second direction, the driving circuit is arranged between the terminator circuit and the first end side. A resistance value control signal line extending in the first direction and transmitting the resistance value control signal, and an enable signal line transmitting the enable signal are arranged between the driving circuit and the first end side in the second direction.

An embodiment will be explained with reference to the drawings as follows.

First Embodiment (1. Configuration)
(1-1. Configuration of Memory System)

Figure 1:
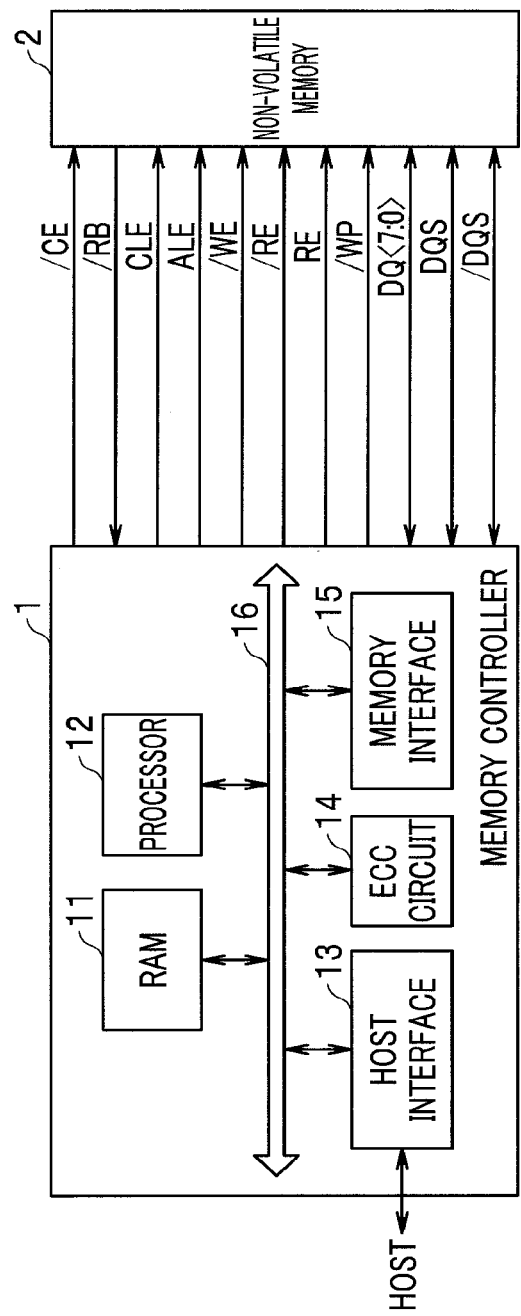
FIG. 1 is a block diagram showing a configuration example of a storage device according to an embodiment of the present invention.

FIG. 1 is a block diagram showing a configuration example of a memory system according to an embodiment of the present invention. The memory system of the present embodiment includes a memory controller 1, and a non-volatile memory 2 as a semiconductor storage device. The memory system can be connected to a host. The host is an electronic apparatus such as, for example, a personal computer and a mobile terminal.

The non-volatile memory 2 is a memory for storing data in a non-volatile manner, and, for example, includes a NAND memory (NAND flash memory). The non-volatile memory 2 is, for example, a NAND memory having a memory cell capable of storing 3 bits per memory cell, i.e., a NAND memory of 3 bit/cell (TLC: triple level cell). Also, the non-volatile memory 2 may be a NAND memory of 1 bit/cell, 2 bit/cell, or 4 bit/cell.

The memory controller 1 controls writing of the data to the non-volatile memory 2 according to a write request from a host. Also, the memory controller 1 controls reading of the data from the non-volatile memory 2 according to a read request from the host. Each signal of a chip enable signal /CE, a ready busy signal /RB, a command latch enable signal CLE, an address latch enable signal ALE, a write enable signal /WE, read enable signals RE, /RE, a write protect signal /WP, signals DQ<7:0> that are data, and data strobe signals DQS, /DQS, between the memory controller 1 and the non-volatile memory 2.

For example, the non-volatile memory 2 and the memory controller 1 are respectively formed as a semiconductor chip (hereinafter, simply referred to as "chip").

The chip enable signal /CE is a signal for enabling the non-volatile memory 2. The ready busy signal /RB is a signal for indicating whether the non-volatile memory 2 is in a ready state (a state for receiving commands from outside) or in a busy state (a state not for receiving the commands from the outside). The command latch enable signal CLE is a signal for indicating that the signals DQ<7:0> are a command. The address latch enable signal ALE is a signal for indicating that the signals DQ<7:0> are an address. The write enable signal /WE is a signal for taking the received signal into the non-volatile memory 2, and is asserted every time the memory controller 1 receives the command, the address and the data. The non-volatile memory 2 is instructed to take the signals DQ<7:0> while the signal /WE is in an "L (low)" level.

The read enable signals RE, /RE are a signal for the memory controller 1 to read data from the non-volatile memory 2. For example, it is used for controlling an operation timing of the non-volatile memory 2 when outputting the signals DQ<7:0>. The write protect signal /WP is a signal for instructing banning of data writing and deletion to the non-volatile memory 2. The signals DQ<7:0> are an entity of the data transmitted and received between the non-volatile memory 2 and the memory controller 1, and includes a command, an address and data. The data strobe signals DQS, /DQS are a signal for controlling a timing of input/output of the signals DQ<7:0>.

The memory controller 1 includes a RAM (random access memory) 11, a processor 12, a host interface 13, an ECC (error check and correct) circuit 14, and a memory interface 15. The RAM 11, the processor 12, the host interface 13, the ECC circuit 14 and the memory interface 15 are connected to each other by an internal bus 16.

The host interface 13 outputs a request, user data (writing data) and the like received from the host to the internal bus 16. Also, the host interface 13 transmits user data read from the non-volatile memory 2, a response from the processor 12 and the like to the host.

The memory interface 15 controls a processing for writing the user data and the like to the non-volatile memory 2 and a processing for reading the user data and the like from the non-volatile memory 2, based on the commands of the processor 12.

The processor 12 generally controls the memory controller 1. The processor 12 is, for example, a CPU (central processing unit), and an MPU (micro processing unit). The processor 12 executes a control according to a request, when the request is received from the host via the host interface 13. For example, according to the request from the host, the processor 12 instructs the memory interface 15 to write the user data and parity to the non-volatile memory 2. Also, the processor 12 instructs the memory interface 15 to read the user data and the parity from the non-volatile memory 2 according to the request from the host.

The processor 12 determines a storage area (memory area) on the non-volatile memory 2 to the user data stored in the RAM 11. The user data is stored in the RAM 11 via the internal bus 16. The processor 12 executes determination of the memory area to data of page unit (page data) that is a writing unit. Herein, the user data stored in one page of the non-volatile memory 2 is defined as unit data. The unit data is generally coded, and stored in the non-volatile memory 2 as a coding language. In the present embodiment, coding is not essential. The memory controller 1 may store the unit data in the non-volatile memory 2 without coding, but a configuration for coding as one configuration example is shown in FIG. 1. When the memory controller 1 does not execute coding, the page data is coincident with the unit data. Also, one coding language may be created based on one unit data, and one coding language may be created based on division data with the unit data divided. Also, one coding language may be created using a plurality of unit data.

The processor 12 determines the memory area of the non-volatile memory 2 to be written per unit data. A physical address is allocated to the memory area of the non-volatile memory 2. The processor 12 manages the memory area to which the unit data is written, using the physical address. The processor 12 instructs the memory interface 15 to write the user data into the non-volatile memory 2 by designating the determined memory area (physical address). The processor 12 manages correspondence between a logical address (logical address managed by the host) of the user data and the physical address. The processor 12 specifies the physical address corresponding to the logical address, and designates the physical address to instruct the memory interface 15 to read out the data, when receiving a read request including the logical address from the host.

The ECC circuit 14 encodes the user data stored in the RAM 11, and generates an encoding language. Also, the ECC circuit 14 decodes the encoding language read from the non-volatile memory 2.

The RAM 11 temporarily stores the user data received from the host in the non-volatile memory 2, and temporarily stores the data read from the non-volatile memory 2 until the data is transmitted to the host. The RAM 11 is a general-purpose memory such as an SRAM (static random access memory) and a DRAM (dynamic random access memory).

FIG. 1 shows a configuration example that the memory controller 1 includes the ECC circuit 14 and the memory interface 15, separately. However, the ECC circuit 14 may be built in the memory interface 15. Also, the ECC circuit 14 may be built in the non-volatile memory 2.

When the read request is received from the host, the memory system is actuated as follows. The processor 12 causes the RAM 11 to temporarily store the data to be a writing object in. The processor 12 reads the data stored in the RAM 11, and inputs it to the ECC circuit 14. The ECC circuit 14 encodes the inputted data, and inputs the encoding language to the memory interface 15. The memory interface 15 writes the inputted encoding language to the non-volatile memory 2.

When the read request is received from the host, the memory system is actuated as follows. The memory interface 15 inputs the encoding language read from the non-volatile memory 2 to the ECC circuit 14. The ECC circuit 14 decodes the inputted encoding language, and stores the decoded data in the RAM 11. The processor 12 transmits the data stored in the RAM 11 to the host via the host interface 13.

(1-2. Configuration of Non-Volatile Memory)

Figure 2:
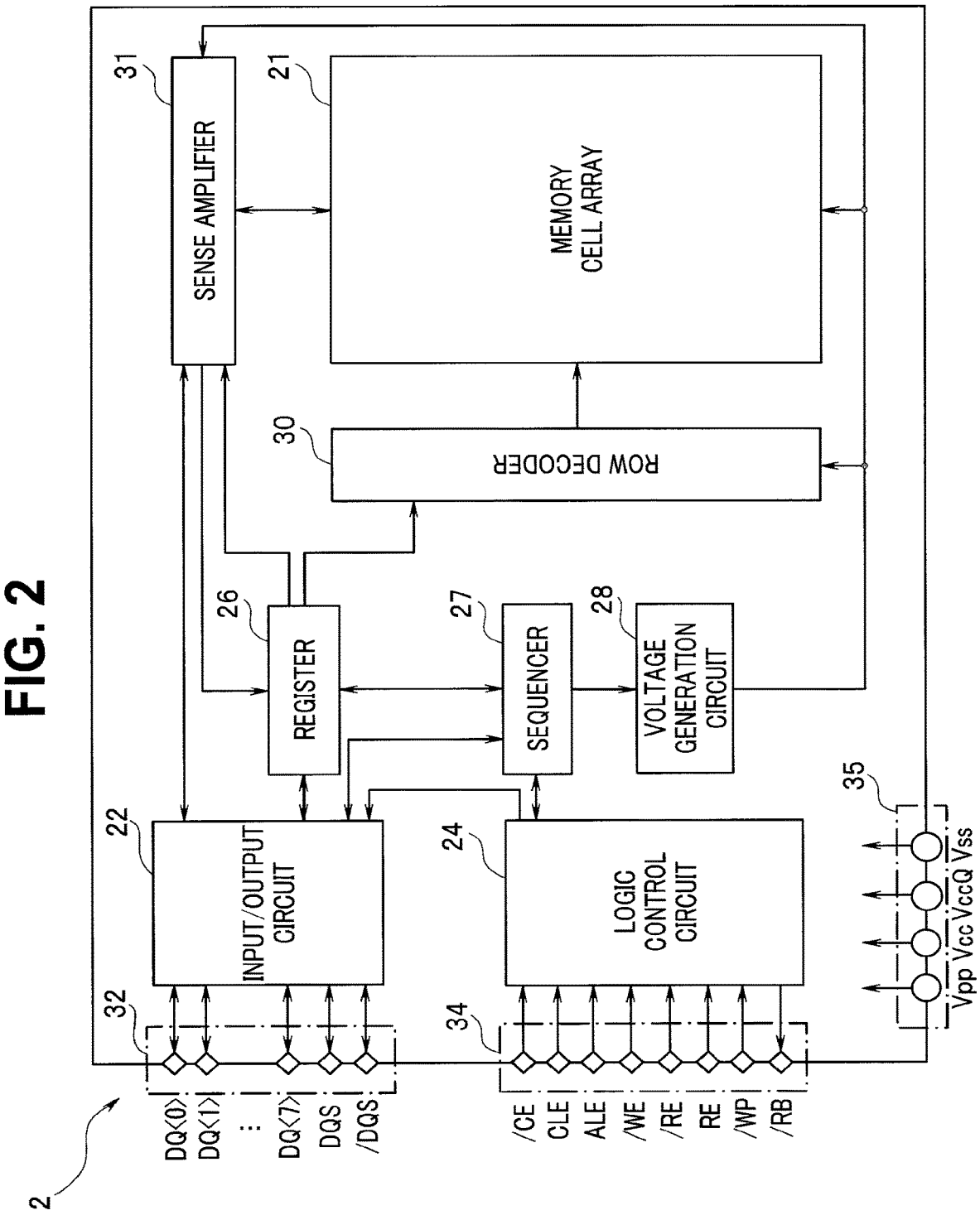
FIG. 2 is a block diagram showing a configuration example of a non-volatile memory according to an embodiment of the present invention.

FIG. 2 is a block diagram showing a configuration example of a non-volatile memory according to the present embodiment. The non-volatile memory 2 includes a memory cell array 21, an input/output circuit 22, a logic control circuit 24, a register 26, a sequencer 27, a voltage generation circuit 28, a row decoder 30, a sense amplifier 31, an inputting/outputting pad group 32, a logic controlling pad group 34, and a power source inputting terminal group 35.

The memory cell array 21 includes a plurality of non-volatile memory cells (not shown) related to a word line and a bit line.

The input/output circuit 22 transmits and receives signals DQ<7:0> and data strobe signals DQS, /DQS to and from the memory controller 1. The input/output circuit 22 transfers a command and an address in the signals DQ<7:0> to the register 26. Also, the input/output circuit 22 transmits and receives the writing data and the reading data to and from the sense amplifier 31.

The logic control circuit 24 receives a chip enable signal /CE, a command latch enable signal CLE, an address latch enable signal ALE, a write enable signal /WE, read enable signals RE, /RE, and a write protect signal /WP from the memory controller 1. Also, the logic control circuit 24 transfers the ready busy signal /RB to the memory controller 1, so as to notify outside of a state of the non-volatile memory 2.

The voltage generation circuit 28 generates a voltage required for operations such as writing, reading and deleting of the data based on the instruction from the sequencer 27.

The row decoder 30 receives a block address and a row address in an address from the register 26, selects a corresponding block based on the block address, and selects a corresponding word line based on the row address.

The sense amplifier 31 senses the reading data read to a bit line from the memory cell, and transfers the sensed reading data to the input/output circuit 22, when reading the data. The sense amplifier 31 transfers the writing data written via the bit line to the memory cell, when writing the data.

The inputting/outputting pad group 32 includes a plurality of terminals (pads) corresponding to the signals DQ<7:0> and the data strobe signals DQS, /DQS for transmitting and receiving each signal including the data to and from the memory controller 1.

The logic controlling pad group 34 includes a plurality of terminal (pads) corresponding to the chip enable signal /CE, the command latch enable signal CLE, the address latch enable signal ALE, the write enable signal /WE, the read enable signals RE, /RE and the write protect signal /WP, for transmitting and receiving each signal to and from the memory controller 1.

The power source inputting terminal group 35 includes a plurality of terminals to input power source voltages Vcc, VccQ, and Vpp and a ground voltage Vss for supplying various operation power sources to the non-volatile memory 2 from outside. The power source voltage Vcc is a circuit power source voltage generally provided from outside as an operation power source, and a voltage of, for example, about 3.3 V is inputted. For example, the power source voltage VccQ of 1.2 V is inputted. The power source voltage VccQ is used when the signals are transmitted and received between the memory controller 1 and the non-volatile memory 2. The power source voltage Vpp is a power source voltage higher than the power source voltage Vcc, and for example, the voltage of 1.2 V is inputted. A high voltage of about 20 V is required, for example, when the data is written to the memory cell array 21 and the data is deleted. At that time, a desired voltage can be generated at a higher speed and lower power consumption by increasing the power source voltage Vpp of about 12 V than by increasing the power source voltage Vcc of about 3.3 V in a booster circuit of a voltage generation circuit 28. For example, when the non-volatile memory 2 is used in such an environment that a high voltage cannot be supplied, the voltage may not be supplied to the power source voltage Vpp. Even when the power source voltage Vpp is not supplied, the non-volatile memory 2 can execute various operations as long as the power source voltage Vcc is supplied. In other words, the power source voltage Vcc is a power source normally supplied to the non-volatile memory 2, and the power source voltage Vpp is a power source additionally and optionally supplied, for example, according to a usage environment.

(1-3. Configuration of ODT Circuit)

Figure 3:
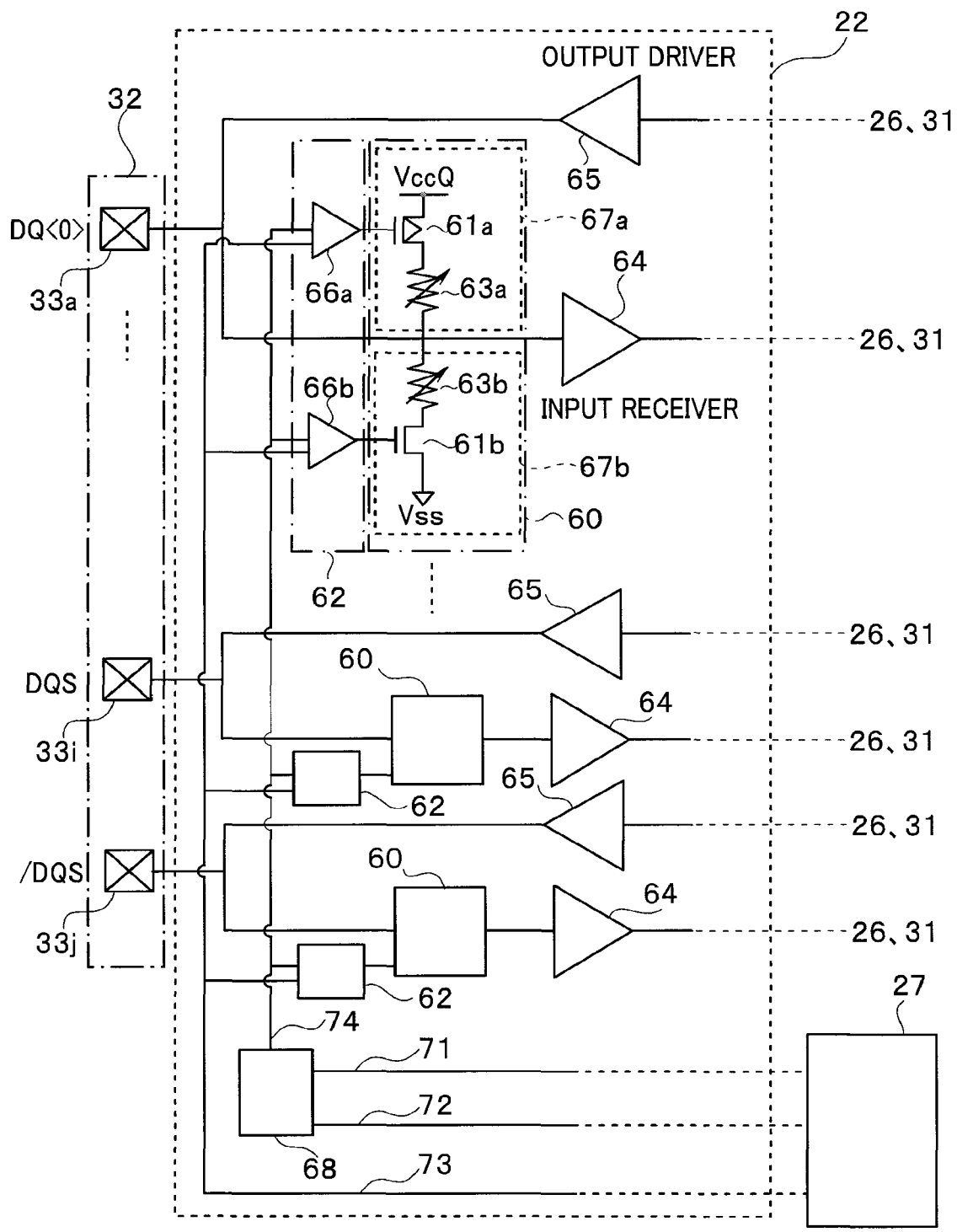
FIG. 3 is a circuit diagram schematically showing connection of an input/output terminal and an input/output circuit.

FIG. 3 is a circuit diagram schematically showing connection of an input/output terminal and an input/output circuit. As shown in FIG. 3, the input/output circuit 22 includes an input circuit having an ODT (on die termination) circuit 60, an ODT driver 62 and an input receiver 64, and an output circuit having an output driver 65 for each corresponding terminal (pad).

The input receiver 64 functions, for example, as a buffer, converts input signals from the memory controller 1, for example, to a proper voltage level for processing the signals in the non-volatile memory 2, and transfers the signals to other circuits in the non-volatile memory 2, including a memory cell array 21.

The output driver 65 functions, for example, as a buffer, converts the signals transferred from the memory cell array 21 to a proper voltage level, and outputs the signals to the memory controller 1. The output driver 65 is also called as an OCD (off chip driver), and is configured, for example, in a manner that a p-channel MOS transistor and an n-channel MOS transistor are serially arranged between a terminal for inputting a power source voltage VccQ and a terminal for inputting a ground voltage Vss.

The ODT circuit 60 functions as a terminator circuit. The ODT circuit 60 is provided between each pad 33 of the inputting/outputting pad group 32 and the input receiver 64. The ODT circuit 60 includes a p-side ODT circuit 67a functioning as a first resistance value adjusting circuit, and an n-side ODT circuit 67b functioning as a second resistance value adjusting circuit. The p-side ODT circuit 67a is configured by a p-channel MOS transistor 61a and a variable resistance element 63a. The n-side ODT circuit 67b is configured by an n-channel MOS transistor 61b and a variable resistance element 63b. Also, resistances such as the variable resistance elements 63a, 63b, a capacitor and a diode can be realized using the MOS transistor.

The ODT driver 62 functions as a driving circuit. The ODT driver 62 inputs enable signals for switching ON (enable state) and OFF (disable state) of the ODT circuit 60, and resistance value controlling signals for instructing a terminal end resistance value to the ODT circuit 60. The ODT driver 62 is configured by a p-side driver 66a functioning as a first driving circuit, and an n-side driver 66b functioning as a second driving circuit.

The p-side driver 66a of the ODT driver 62 is connected to the p-side ODT circuit 67a of the ODT circuit 60. The p-side ODT circuit 67a is actuated according to the enable signals inputted from the p-side driver 66a. Also, the n-side driver 66b of the ODT driver 62 is connected to the n-side ODT circuit 67b of the ODT circuit 60. The n-side ODT circuit 67b is actuated according to the enable signals inputted from the n-side driver 66b.

In the p-channel MOS transistor 61a, the enable signals are inputted to a gate from the p-side driver 66a, the power source voltage VccQ is applied to a source, and a drain is connected to one end of the variable resistance element 63a. The p-channel MOS transistor 61a functions as a first switch part for connecting a voltage line (power source voltage line) to which the power source voltage VccQ is applied, with the variable resistance element 63a.

The other end of the variable resistance element 63a is connected to a wiring for connecting the pad 33 and the input receiver 64, and one end of the variable resistance element 63b. A resistance value of the variable resistance element 63a functioning as a first resistance value adjusting part is set according to resistance value controlling signals inputted from the n-side driver 66b. Also, a resistance value of the variable resistance element 63b functioning as a second resistance value adjusting part is set according to resistance value controlling signals inputted from the n-side driver 66b. When the variable resistance elements 63a, 63b are realized using an MOS transistor, for example, a plurality of MOS transistors are parallelly connected to each other, so as to configure the resistance value adjusting part. By selectively switching on a predetermined transistor among the plurality of MOS transistors according to the resistance value controlling signals, the resistance value is adjusted.

In an n-channel MOS transistor 61b, enable signals are inputted to a gate from the n-side driver 66b, a drain is connected to the other end of the variable resistance element 63b, and a ground voltage Vss is applied to a source. The n-channel MOS transistor 61b functions as a second switch part for connecting a voltage line (ground voltage line) to which the ground voltage Vss is applied, and the variable resistance element 63b.

The ODT driver 62 provided corresponding to each pad is connected to a decoder 68. The decoder 68 is connected to an ODT resistance value setting signal line 71 and a process trimming signal line 72 from the sequencer 27. The decoder 68 generates ODT controlling signals as resistance value controlling signals, based on signals inputted from the ODT resistance value setting signal line 71 and the process trimming signal line 72. Each driver 62 is connected to the control signal line 74 for transmitting the ODT controlling signals to the corresponding ODT circuit 60. Also, each driver 62 is connected to the ODT enable signal line 73 for transmitting enable signals to switch on and off the corresponding ODT circuit 60. The sequencer 27 and the decoder 68 function as controlling circuits.

(2. Layout)

(2-1. Pad Layout on Chip)

Figure 4:
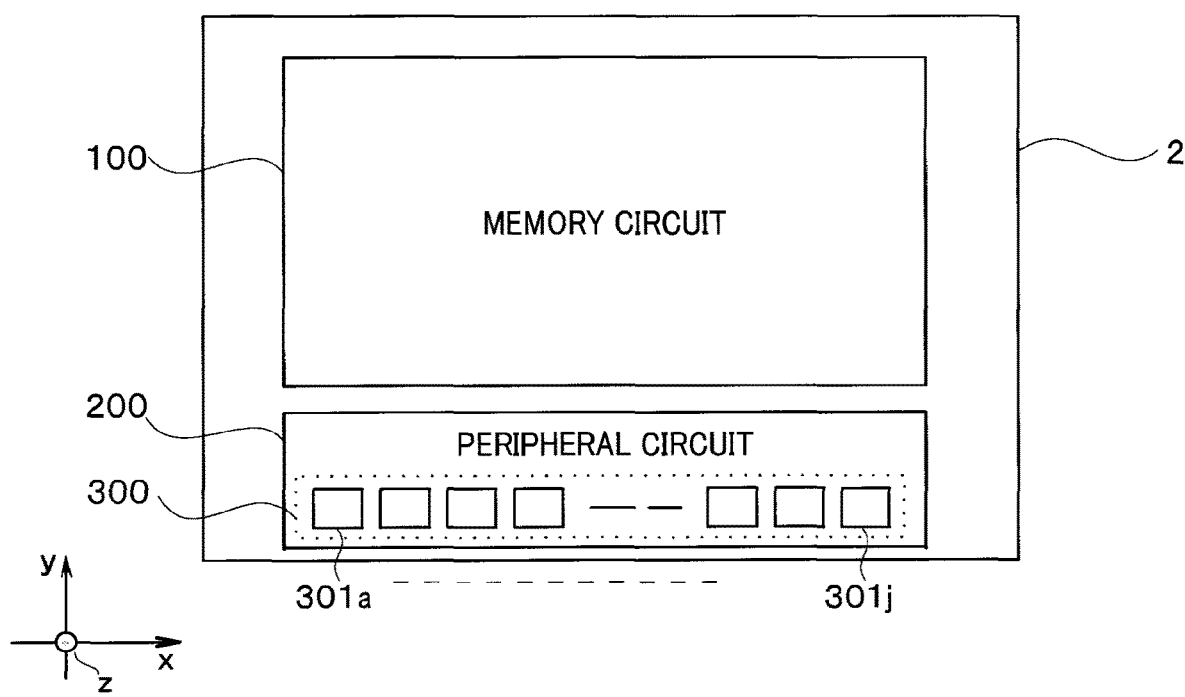
FIG. 4 is an outline layout diagram of the non-volatile memory on a chip.

FIG. 4 is a schematic layout diagram of a non-volatile memory on a chip. In other words, FIG. 4 is a schematic layout diagram on an XY plane of the non-volatile memory seen from a Z-direction.

As shown in FIG. 4, the non-volatile memory 2 in this embodiment is generally blocked into two regions (a memory circuit 100, a peripheral circuit 200) in a Y-direction (second direction) on a chip having an approximately rectangular shape. A pad part 300 is provided on the peripheral circuit 200. The two regions (the memory circuit 100, the peripheral circuit 200) are provided across almost an entire region in an X-direction (first direction) at respective positions in the Y-direction. In following explanation, relating to a region occupied with each component element of the non-volatile memory 2 on the chip, length of the region in the X-direction may be designated as "width" and length in the Y-direction may be designated as "height". Length of the region in the Z-direction is designated as "depth".

Mainly a memory cell array 21, a row decoder 30 and a sense amplifier 31 are arranged in the memory circuit 100 arranged on an upward side in a height direction of the chip (one end side, a second end side in the Y-direction).

A pad part 300, as well as an input/output circuit 22 (except for component elements included in an I/O part 301), a register 26, a sequencer 27, a voltage generation circuit 28, a logic control circuit 24 and the like are arranged in the peripheral circuit 200 arranged on a downward side in the height direction of the chip (the other end side, a first end side in the Y-direction).

A plurality of I/O parts 301 are one-dimensionally aligned in the pad part 300 arranged at the downward side in the height direction of the chip (the other end side, the first end side in the Y-direction) at predetermined intervals along a chip end. One pad included in an inputting/outputting pad group 32, and one pad included in a logic controlling pad group 34 are arranged in each I/O part 301, respectively. An ODT circuit 60, an ODT driver 62, and an output driver 65 corresponding to each pad are arranged at each I/O part 301.

(2-2. Layout of Pad Part)

Figure 5:
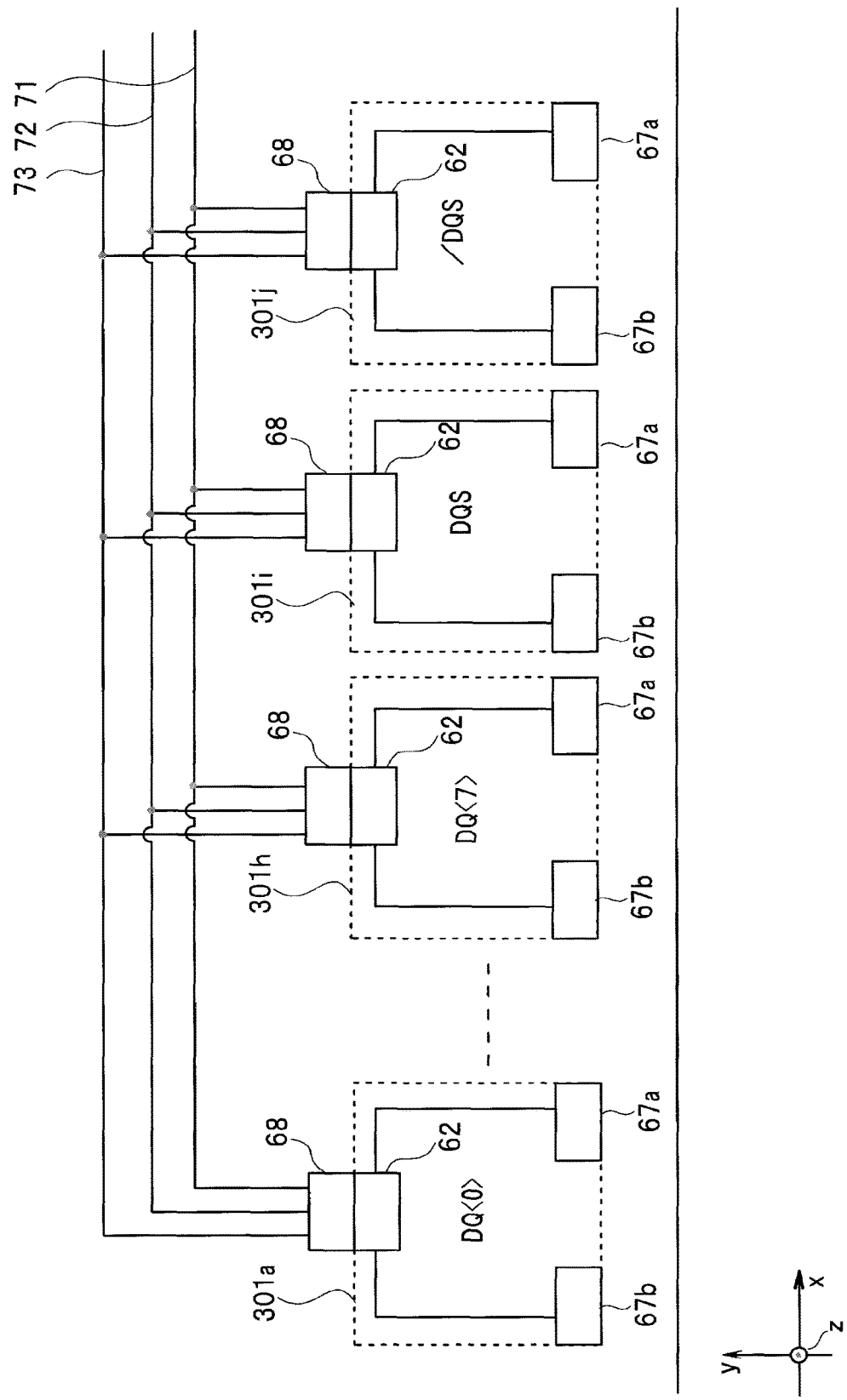
FIG. 5 is a layout diagram of a pad part of the non-volatile memory according to a comparison example.

In explaining a layout of the pad part 300 in this embodiment, the layout of the pad part 300 in a comparison example will be first explained using FIG. 5. FIG. 5 is a layout diagram of a pad part in a non-volatile memory in the comparison example. A plurality of I/O parts 301 and a decoder 68 are arranged on the pad part 300. An ODT resistance value setting signal line 71, a process trimming signal line 72 and an ODT enable signal line 73 for transmitting control signals from the sequencer 27 are arranged on the ODT circuit 60 provided at the I/O part 301.

I/O parts 301a-301j are aligned at predetermined intervals in a width direction (X-direction) along one side of a chip end in a height direction (Y-direction). In each of the I/O parts 301a-301j with an approximate rectangular shape, a corresponding pad (not illustrated in FIG. 5) is arranged at a center part. For example, a pad for inputting a signal DQ<0> is arranged at the I/O part 301a, and a pad for inputting a signal DQ<7> is arranged at the I/O part 301h. A pad for inputting a data strobe signal DQS is arranged at the I/O part 301i, and a pad for inputting a data strobe signal/DQS is arranged at the I/O part 301h.

The ODT circuit 60 is arranged on a chip end side in the height direction (Y-direction) at the I/O parts 301a-301j. For example, as shown in FIG. 5, a p-side ODT circuit 67a and an n-side ODT circuit 67b are arranged at two corners on a chip end side at the I/O part 301 with an approximately rectangular shape, as shown in FIG. 5.

The ODT driver 62 is arranged near a center part on one side on a chip upward side in the height direction (Y-direction) at each of the I/O parts 301a-301j. Therefore, signal lines are arranged on both sides in a width direction (X-direction) of the pad, to connect the ODT driver 62 and the ODT circuit 60 (a p-side ODT circuit 67a and an n-side ODT circuit 67b). The decoder 68 is arranged to approach to the ODT driver 62 of each of the I/O parts 301a-301j.

An ODT resistance value setting signal line 71, a process trimming signal line 72 and an ODT enable signal line 73 are arranged on a chip upward side in the height direction (Y-direction) of the decoder 68.

In the pad part 300 in a comparison example as laid out above, width of the I/O parts 301a-301j (length in an X-direction) is a size obtained by adding width of the pad (length in the X-direction) and width of an arrangement region of a signal line for connecting the ODT driver 62 and the ODT circuit 60. Height of the I/O parts 301a-301j (length in the Y-direction) is a size obtained by adding height of the ODT driver 62 (length in the Y-direction), height of the pad (length in the Y-direction), and height of the ODT circuit 60 (length in the Y-direction). Height of the pad part 300 (length in the Y-direction) is a size obtained by adding height of the I/O parts 301a-301j (length in Y-direction), height of the decoder 68 (length in the Y-direction), and height of an arrangement region of the signal lines 71-73 (height in the Y-direction).

Figure 6:
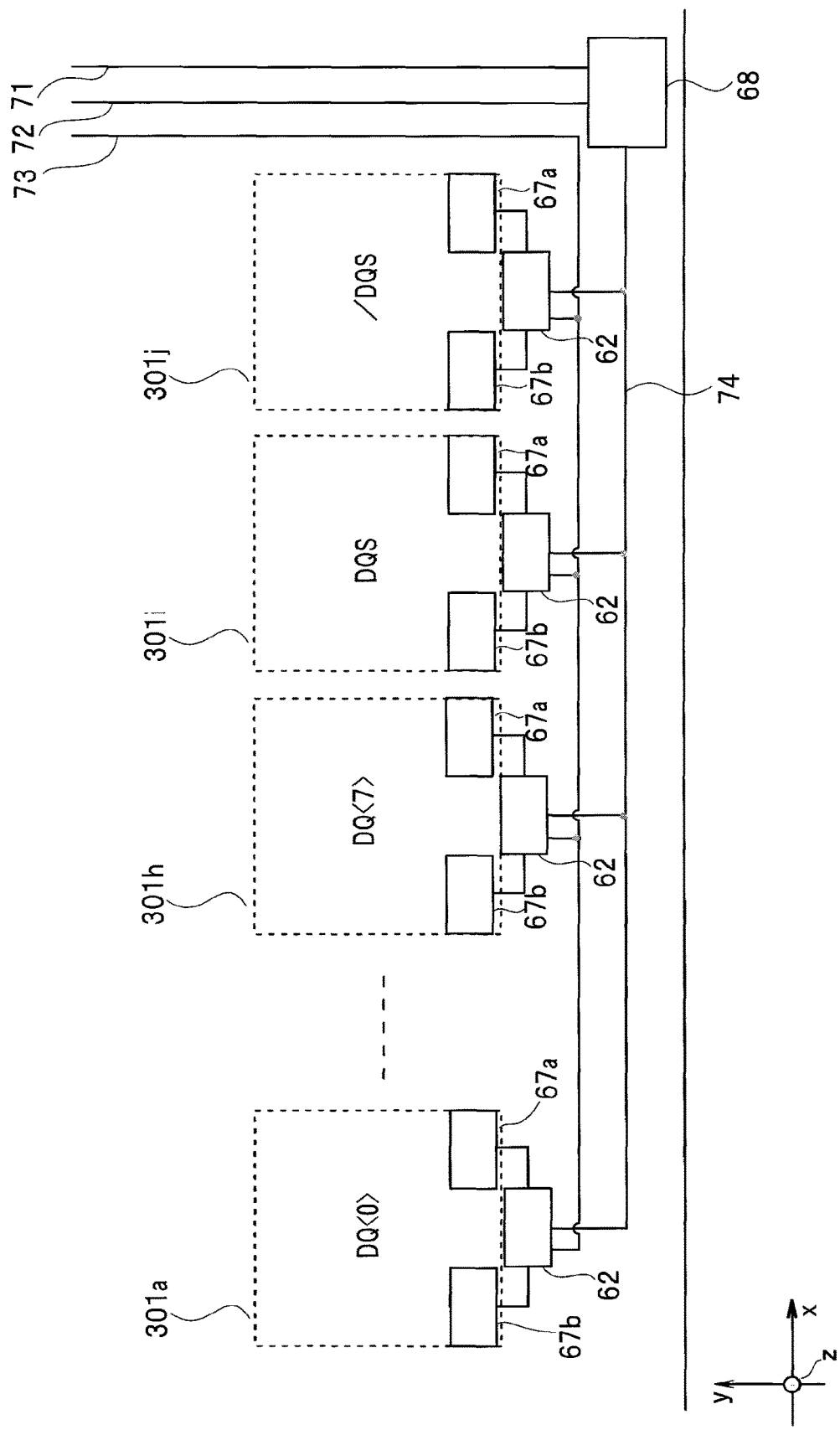
FIG. 6 is a layout diagram of a pad part according to a first embodiment.

Then, the layout of the pad part 300 in this embodiment will be explained using FIG. 6. FIG. 6 is a layout diagram of a pad part according to a first embodiment. Elements arranged at the pad part 300 in this embodiment are similar to those of the pad part of the non-volatile memory in the comparison example. In other words, a plurality of I/O parts 301 and a decoder 68 are arranged, and an ODT resistance value setting signal line 71, a process trimming signal line 72 and an ODT enable signal line 73 are arranged to transmit controlling signals from a sequencer 27.

Also, a corresponding pad (not illustrated in FIG. 6) is arranged at a center part of one side on an upward end in a height direction of each of I/O parts 301a-301j (the other end side in the Y-direction). A p-side ODT circuit 67a and an n-side ODT circuit 67b are arranged at two corners on a chip end side.

The ODT driver 62 is arranged near a center part on one side on a downward side in the chip height direction (the other end side or the chip end side in the Y-direction) at each of the I/O parts 301a-301j. Accordingly, the ODT driver 62 and the ODT circuit 60 (the p-side ODT circuit 67a and the n-side ODT circuit 67b) are arranged adjacent to each other.

The ODT enable signal line 73, and the ODT control signal line 74 for inputting ODT controlling signals to each ODT driver 62 from the decoder 68 are arranged on a downward side in a height direction of the I/O parts 301a-301j (the other end side or the chip end side in the Y-direction). In a region in which the signal lines 73 and 74 are arranged, the decoder 68 is arranged in a region not overlapping with the I/O parts 301a-301j in the width direction (X-direction). The ODT resistance value setting signal line 71, the process trimming signal line 72 and the ODT enable signal line 73 for transmitting controlling signals from the sequencer 27 provided on the peripheral circuit 200 are arranged on an upward side in a height direction of the decoder 68 (one end side in the Y-direction, i.e., in a right region of the I/O part 301j.

In other words, the signal lines 73, 74 and the decoder 68 are arranged on the chip end side (the other end side in the Y-direction) at the pad part 300, and the I/O parts 301a-301j and the signal lines 71-73 are arranged on an upward side in the height direction (one end side in the Y-direction). The decoder 68 is commonly used for the I/O parts 301a-301j, and arranged at a position not overlapping with the I/O parts 301a-301j in the width direction (X-direction). Therefore, compared to the pad part 300 in the comparison example shown in FIG. 5, the height of the pad part 300 (length in the Y-direction) can be reduced.

Figure 7:
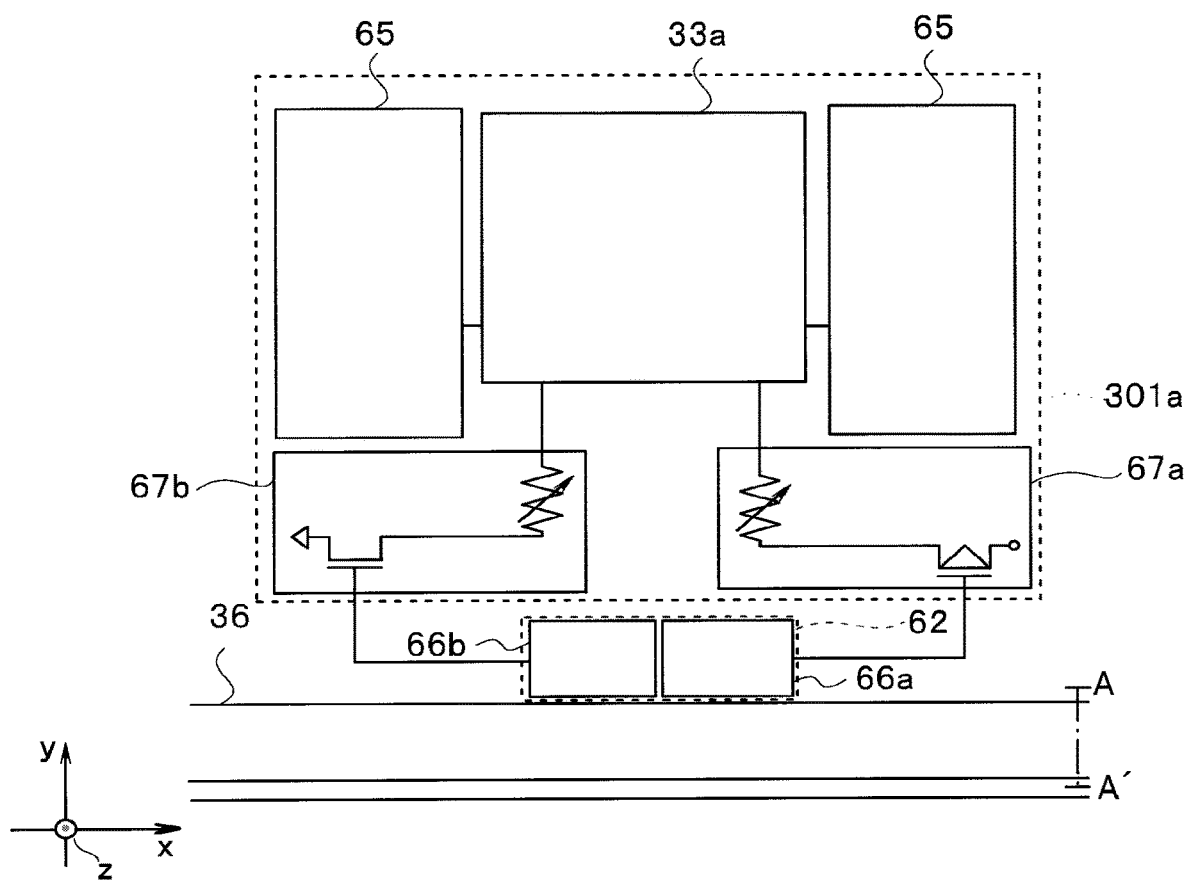
FIG. 7 is a layout diagram of an I/O part.

Then, an arrangement example of an I/O part 301 and signal lines 71-73 inputted to the I/O part 301 will be explained using FIG. 7. FIG. 7 is a layout diagram of the I/O part. In FIG. 7, a pad 33a for inputting a signal DQ<0> is arranged. An I/O part 301a is shown as one example, but other I/O parts 301 have a similar configuration.

The pad 33a is arranged along one side of an end on upward side in a height direction (one end side in the Y-direction) near a center in a width direction (X-direction) of the I/O part 301a that is an approximately rectangular region. Output drivers 65 are arranged on both sides in a width direction (X-direction) of the pad 33a. When the output drivers 65 are configured so that, for example, a p-channel MOS transistor and an n-channel MOS transistor are serially arranged between a terminal to which a power source voltage VccQ is inputted and a terminal to which a ground voltage Vss is inputted, for example, the p-channel MOS transistor is arranged on right side in the width direction of the pad 33a (one end side in the X-direction), and the n-channel MOS transistor is arranged on a left side in the width direction of the pad 33a (the other end side in the X-direction).

The ODT circuit 60 is arranged on a downward side in the height direction of the pad 33a (the other end side in the Y-direction). Concretely, the p-side ODT circuit 67a is arranged on a right side in the width direction (one end side in the X-direction), and the n-side ODT circuit 67b are arranged on a left side in the width direction (the other end side in the X-direction).

A p-side driver 66a of the ODT driver 62 is arranged on a downward side in a height direction of the p-side ODT circuit 67a (the other end side in the Y-direction). An n-side driver 66b of the ODT driver 62 is arranged on a downward side in a height direction of the n-side ODT circuit 67b (the other end side in the Y-direction).

In the pad part 300 in the comparison example shown in FIG. 5, the ODT circuit 60 and the ODT driver 62 are respectively arranged near an end side on an upward side in the height direction of the I/O part 301a (one end side in the Y-direction) and near an end side of a downward side in the height direction (the other end side in the Y-direction). Therefore, signal lines are arranged on both sides in the width direction (X-direction) of the pad 33a, to input controlling signals to the ODT circuit 60 from the ODT driver 62. In this embodiment, both of the ODT circuit 60 and the ODT driver 62 are arranged near an end side on a downward side in the height direction of the I/O part 301a (the other end side in the Y-direction), so that signal lines for transmitting the controlling signals to the ODT circuit 60 from the ODT driver 62 can be made short. Thus, a wiring delay can be reduced, and a setup time of the ODT circuit 60 can be reduced.

When the ODT circuit 60 and the ODT driver 62 are arranged adjacent to each other, a size of a buffer for compensating the wiring delay can be reduced, so as to reduce an area of the ODT driver 62. Accuracy of a timing control for simultaneously turning on and off the p-side ODT circuit 67a and the n-side ODT circuit 67b is improved, so that glitches can be prevented. There is no need of arranging signal lines in the height direction (Y-direction) on both sides in the width direction (X-direction) of the pad 33a, so that the width of the I/O part 301a (length in the X-direction) can be made narrow.

A wiring region 36 is provided along one side of a chip end on a downward side in the height direction of the ODT driver 62 (the other end side in the Y-direction), i.e., a downward side in the height direction (the other end side in the Y-direction). The ODT enable signal line 73, the ODT control signal line 74, as well as signal lines for transmitting the power source voltage Vpp and the ground voltage Vss are arranged in the wiring region 36. The wiring region 36 has a plurality of wiring layers in a depth direction (Z-direction), and the signal lines are allocated to any of the plurality of wiring layers.

Figure 8:
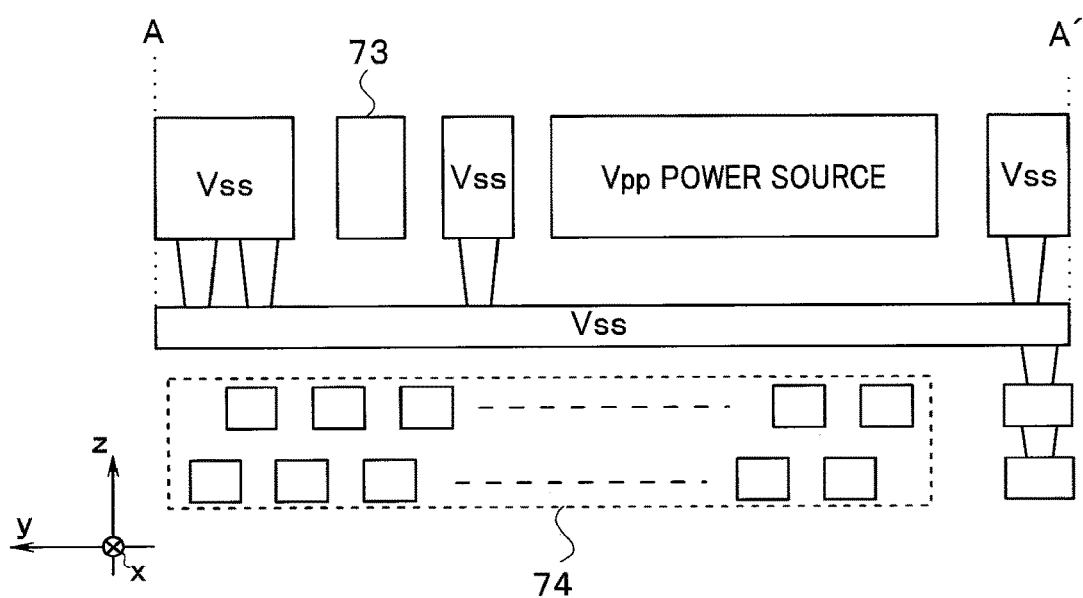
FIG. 8 is a cross sectional view along an A-A' line of FIG. 7.

A cross section structure of the wiring region 36 will be explained using FIG. 8. FIG. 8 is a cross section view along a line A-A of FIG. 7. The example in FIG. 8 shows a case where 4 wiring layers are provided.

As shown in FIG. 8, four wiring layers are formed on a semiconductor substrate across an insulation layer. The insulation layer is formed using, for example, a silicon oxidation membrane. Generally, a lower wiring layer has higher resistance. Accordingly, a signal line that has a need of high-speed transmission is allocated to an upper layer.

The ODT control signal line 74 is allocated to the lowermost wiring layer and the second wiring layer from the bottom among the four wiring layers. The signal line for transmitting the ground voltage Vss is also allocated to the lowermost wiring layer and a part of the second wiring layer from the bottom. The signal line for transmitting the ground voltage Vss is allocated to the third wiring layer from the bottom. The wiring layer transmits the ground voltage Vss, and also has a role to shield the uppermost wiring layer and the ODT control signal line 74.

The signal lines for transmitting the power source voltage Vpp and the ground voltage Vss, and the ODT enable signal line 73 are allocated to the uppermost wiring layer. In particular, the ODT enable signal line 73 has a need of high-speed transmission to transmit signals (enable signals) for controlling on/off of the ODT circuit 60. Accordingly, the line is arranged on the uppermost wiring layer, so that the setup time of the ODT circuit 60 can be reduced. The signal line for transmitting the ground voltage Vss on the uppermost layer and the second wiring layer from a top are connected by a contact wiring. The second wiring layer from the top and the semiconductor substrate are connected by the signal lines for transmitting the ground voltage Vss allocated to the lowermost wiring layer and the second wiring layer from the bottom, and the contact wiring layer for connecting the wiring layers. In other words, when the ground voltage Vss is inputted from outside, the voltage of the semiconductor substrate can also be controlled to Vss.

As described above, the wiring region 36 has a plurality of wiring layers, so that the ODT control signal line 74 can be arranged on a lower layer of the signal line for transmitting the power source voltage Vpp and the ground voltage Vss. Thus, an area of the wiring region 36 can be restrained from increasing.

As described above, in this embodiment, at each I/O part 301 of the pad part 300, the ODT circuit 60 and the ODT driver 62 are arranged adjacent to a chip end side. One decoder 68 is commonly used for the plurality of I/O parts 301. Furthermore, the wiring region 36 is provided along one side of a chip end on a downward side in the height direction of the ODT driver 62 (the other end side in the Y-direction), i.e., a downward side in the height direction (the other end side in the Y-direction), a plurality of wiring layers are formed in the wiring region 36 in the depth direction (Z-direction), and the ODT control signal line 74 is formed on a lower layer of the signal line for transmitting the power source voltage Vpp and the ground voltage Vss. Thus, the area of the pad part 300 can be reduced, and a chip area can be restrained from increasing.

Also, the ODT circuit 60 and the ODT driver 62 are arranged adjacent to each other, so that a wiring delay and a setup time can be reduced. Accuracy of a timing control for simultaneously turning on and off the p-side ODT circuit 67a and the n-side ODT circuit 67b is improved, so that glitches can be prevented.

Second Embodiment

Then, a semiconductor storage device according to a second embodiment of the present invention will be explained. In the semiconductor storage device in this embodiment, a layout of the ODT circuit 60 and the ODT driver 62 of the I/O part 301 is different from that in the semiconductor storage device in the above-mentioned first embodiment. A configuration of the semiconductor storage device and the layout of elements except for the I/O part 301 in this embodiment are similar to those of the semiconductor storage device in the above-mentioned first embodiment, and explanation thereof will be omitted. Hereinafter, only matters different from those in the first embodiment will be explained.

Figure 9:
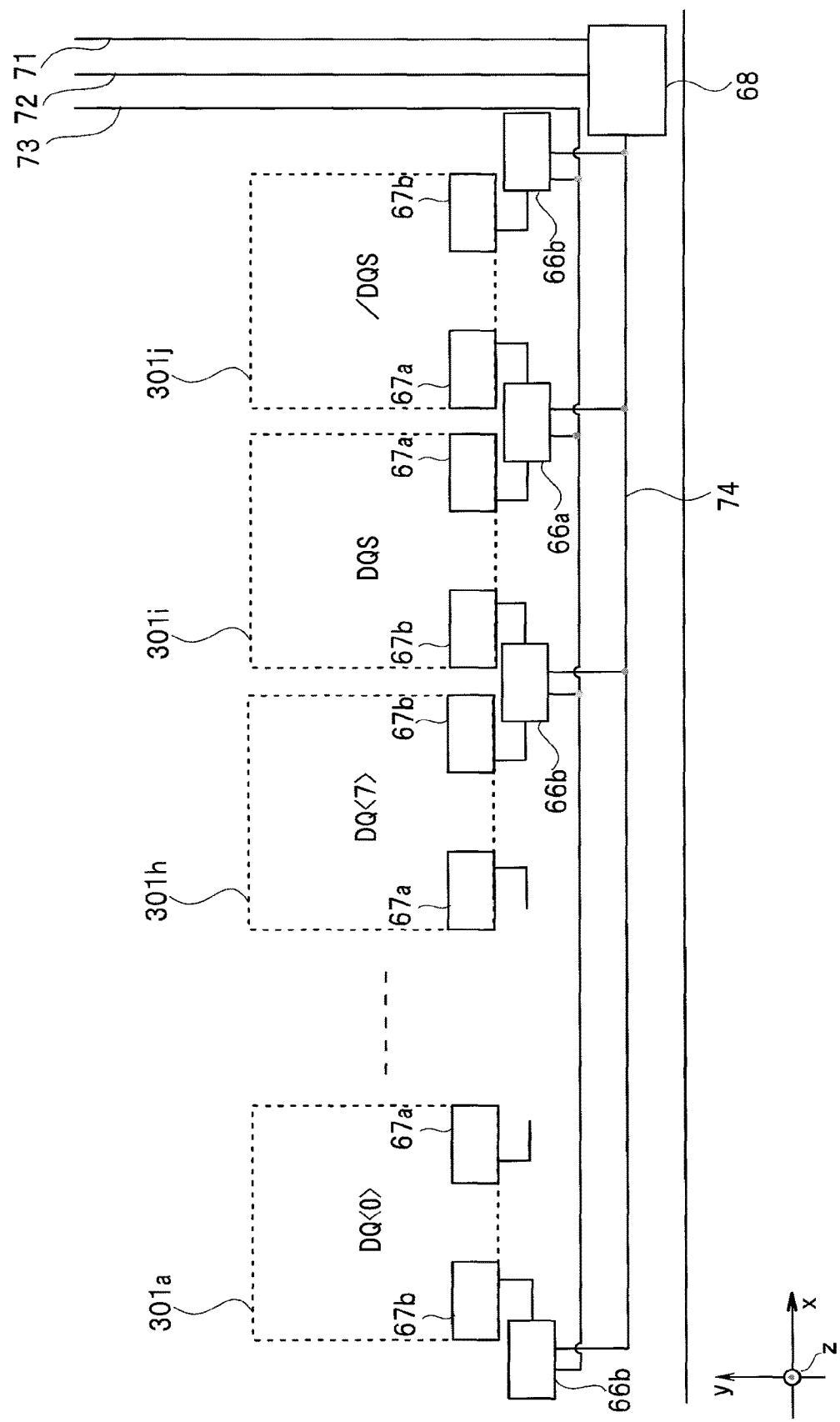
FIG. 9 is a layout diagram of a pad part according to a second embodiment.

FIG. 9 is a layout diagram of a pad part according to a second embodiment. A plurality of I/O parts 301 are aligned in a pad part 300 arranged at an end of a downward side in a height direction of a chip (the other end side in the Y-direction) in a width direction (X-direction) along a chip end at predetermined intervals. A corresponding pad is arranged near a center of one side of an upward end side in a height direction of each of I/O parts 301a-301j. Furthermore, the p-side ODT circuit 67a and the n-side ODT circuit 67b are arranged at two corners of a chip end side (the other end side in the Y-direction).

The ODT circuit 60 of each I/O part 301 is arranged in a manner that horizontal arrangement of the p-side ODT circuit 67a and the n-side ODT circuit 67b is inverted between the I/O parts 301 adjacent to each other. Concretely, in the I/O parts 301a, 301i of an odd-number counted from a left side in a width direction (the other end side in the X-direction), the n-side ODT circuit 67b is arranged at left corner on a chip end side in the height direction (Y-direction), and the p-side ODT circuit 67a is arranged at a right corner on the chip end side in the height direction (Y-direction). Also, in I/O parts 301b . . . 301h, 301j of an even number counted from a left side in the width direction (the other end side in the X-direction), the p-side ODT circuit 67a is arranged at a left corner of a chip end side in the height direction (Y-direction) and the n-side ODT circuit 67b is arranged at a right corner on the chip end side in the height direction (Y-direction).

In other words, in the adjacent I/O parts 301, the p-side ODT circuit 67a and the n-side ODT circuit 67b are arranged, so that MOS transistors of the ODT circuits 60 adjacent to each other has the same type.

Also, the ODT driver 62 is arranged on one side of a downward side in a height direction of a chip (the other end side or a chip end side in the Y-direction) at each of the I/O parts 301a-301j. A position in a width direction (X-direction) is almost near centers of the I/O parts 301 adjacent to each other. Furthermore, when the ODT circuits 60 arranged adjacent to each other are p-side ODT circuits 67a, the p-side driver 66a is arranged as an ODT driver 62. When the ODT circuits 60 arranged adjacent to each other are n-side ODT circuits 67b, the n-side driver 66b is arranged as an ODT driver 62. In other words, the adjacent I/O parts 301 are commonly used for the ODT driver 62.

As described above, in this embodiment, in the adjacent I/O parts 301, the p-side ODT circuits 67a or the n-side ODT circuits 67b controlled in the same manner are arranged adjacent to each other. The two p-side ODT circuits 67a or the two n-side ODT circuits 67b arranged adjacent to each other commonly uses one ODT driver 62. Thus, the area of the pad part 300 can further be reduced.

Third Embodiment

Then, a semiconductor storage device according to a third embodiment of the present invention will be explained. The semiconductor storage device in this embodiment is different from the semiconductor storage device in the above-mentioned first embodiment, in that a delay circuit 69 is provided at a middle of the ODT enable signal line 73. A configuration of the semiconductor storage device and the layout of the I/O part 301 except for the delay circuit 69 in this embodiment are similar to those of the semiconductor storage device in the above-mentioned first embodiment, and explanation thereof will be omitted. Hereinafter, only matters different from those in the first embodiment will be explained.

Figure 10:
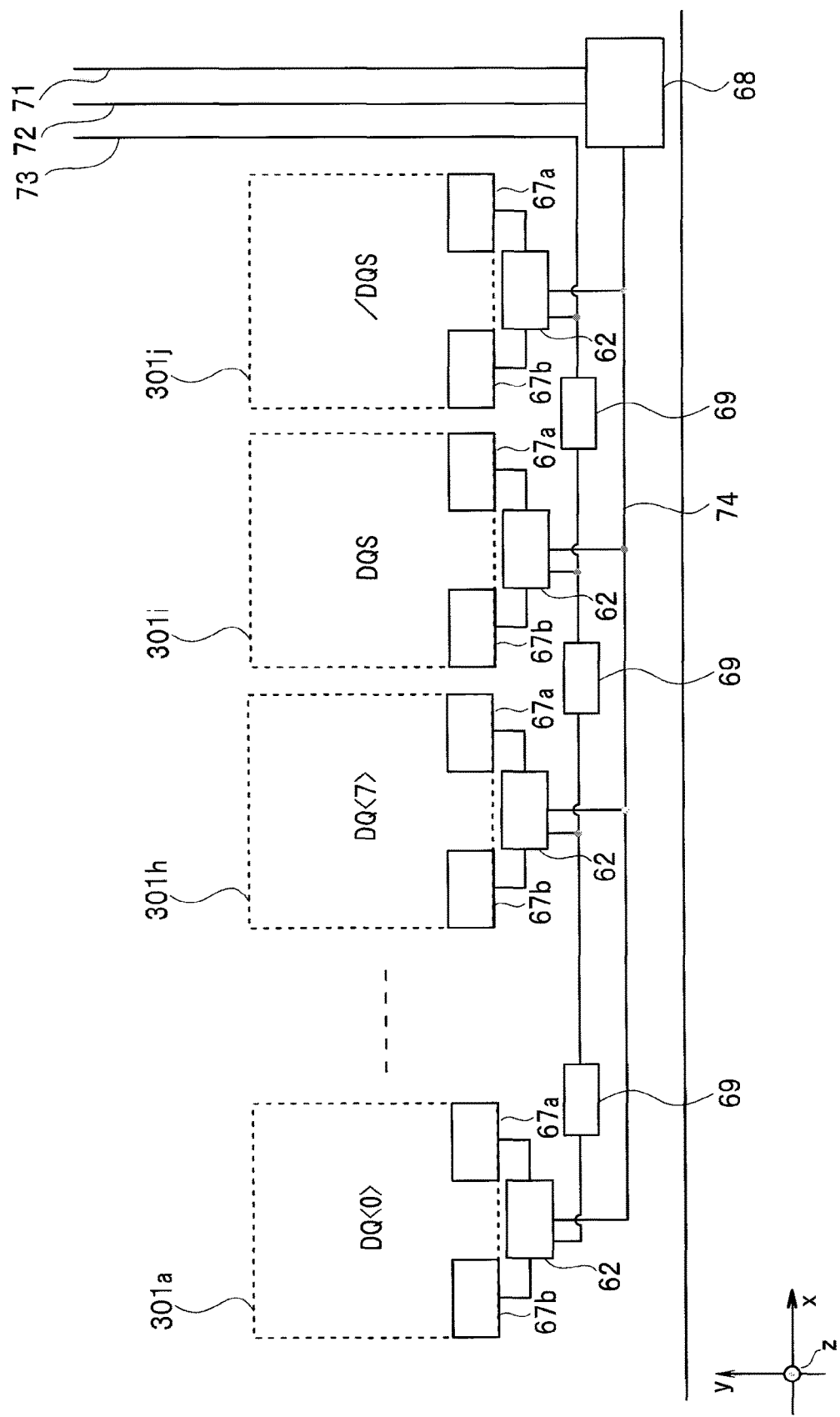
FIG. 10 is a layout diagram of a pad part according to a third embodiment.

FIG. 10 is a layout diagram of a pad part according to a third embodiment. A plurality of delay circuits 69 are serially arranged in the ODT enable signal line 73 arranged in the wiring region 36. Each delay circuit 69 is configured by, for example, a two-stage inverter, so as to delay transmission of the ODT enable (enable signal) by a predetermined time. Each delay circuit 69 is provided before a signal line branch point of each I/O part 301 to the ODT driver 62 from the ODT enable signal line 73.

In this manner, the delay circuit 69 is provided at the middle of the ODT enable signal line 73, so that the ODT circuit 60 of each I/O part 301 can be switched on and off at a different timing. Thus, by switching on the plurality of ODT circuit 60 at the same time, a large amount of a current can be prevented from flowing, and a peak current can be reduced.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor storage device including:
a memory cell array in which a plurality of memory cells are aligned;
a pad to which data written to the memory cell array is inputted;
a terminator circuit connected to the pad;
a driving circuit configured to be selectively brought into an enable state or a disable state based on an enable signal, and to drive the terminator circuit to a predetermined resistance value based on a resistance value control signal when the driving circuit is being brought into the enable state based on the enable signal; and
a control circuit configured to supply the enable signal and the resistance value control signal to the driving circuit, wherein
the semiconductor storage device includes a first end side and a second end side extending in a first direction, and a third end side and a fourth end side extending in a second direction orthogonal to the first direction,
in the second direction, the pad is arranged between the memory cell array and the first end side,
in the second direction, the terminator circuit is arranged between the pad and the first end side,
in the second direction, the driving circuit is arranged between the terminator circuit and the first end side, and
a resistance value control signal line extending in the first direction and transmitting the resistance value control signal, and an enable signal line transmitting the enable signal are arranged between the driving circuit and the first end side in the second direction.

2. The semiconductor storage device according to claim 1, further comprising:
a low-voltage side power source line, and
the resistance value control signal line is arranged on a lower layer of the low-voltage side power source line.

3. The semiconductor storage device according to claim 2, wherein
the control circuit includes a decoder configured to transmit the resistance value control signal to the resistance value control signal line,
the pad is arranged in plurality in the first direction,
the decoder is arranged on a side in the first direction of a plurality of pads, and
the decoder does not overlap with any of the plurality of pads when seen from the second direction.

4. The semiconductor storage device according to claim 3, wherein
the terminator circuit is arranged in plurality respectively corresponding to the plurality of pads,
each of the plurality of terminator circuits includes a first resistance value adjusting circuit and a second resistance value adjusting circuit respectively arranged on both ends in the first direction of a corresponding pad,
the first resistance value adjusting circuit includes a first resistance value control part connected to the corresponding pad and a first switch part configured to electrically connect the first resistance value control part and a high-voltage side power source line, and
the second resistance value adjusting circuit includes a second resistance value control part connected to the corresponding pad, and a second switch part configured to electrically connect the second resistance value control part and the low-voltage side power source line.

5. The semiconductor storage device according to claim 4, wherein
the driving circuit is arranged in plurality,
each of the plurality of driving circuit includes
a first driving circuit configured to drive a corresponding first resistance value adjusting circuit, and
a second driving circuit configured to drive a corresponding second resistance value adjusting circuit, and
each of the plurality of driving circuits is arranged between a corresponding terminator circuit and the first end side in the second direction.

6. The semiconductor storage device according to claim 5, wherein
each of the plurality of first resistance value adjusting circuits includes a plurality of first transistors including a first semiconductor type,
each of the plurality of second resistance value adjusting circuits includes a plurality of second transistors including a second semiconductor type different from the first semiconductor type,
each of the plurality of first driving circuits turns on at least one part of the plurality of first transistors of the corresponding first resistance value adjusting circuit under the enable state, and
each of the plurality of second driving circuits turns on at least one part of the plurality of second transistors of the corresponding second resistance value adjusting circuit under the enable state.

7. The semiconductor storage device according to claim 4, wherein
among two of the pads adjacent to each other in the first direction,
the first resistance value adjusting circuit corresponding to one of the pads,
the second resistance value adjusting circuit corresponding to the one of the pads,
the second resistance value adjusting circuit corresponding to another one of pads, and
the first resistance value adjusting circuit corresponding to the other pad are sequentially arranged in the first direction.

8. The semiconductor storage device according to claim 7, wherein
the driving circuit includes
a plurality of first driving circuits and
a plurality of second driving circuits,
each of the plurality of first driving circuits is configured to drive two of the first resistance value adjusting circuits adjacent to each other in the first direction, and
each of the plurality of second driving circuits is configured to drive two of the second resistance value adjusting circuits adjacent to each other in the first direction.

9. The semiconductor storage device according to claim 8, wherein
each of the plurality of first resistance value adjusting circuits includes a plurality of first transistors including a first semiconductor type,
each of the plurality of second resistance value adjusting circuits includes a plurality of second transistors including a second semiconductor type different from the first semiconductor type,
each of the plurality of first driving circuits turns on at least one part of the plurality of first transistors of the corresponding first resistance value adjusting circuit under the enable state, and each of the plurality of second driving circuits turns on at least one part of the plurality of second transistors of the corresponding second resistance value adjusting circuit under the enable state.

10. The semiconductor storage device according to claim 4, further including a delay circuit configured to delay the enable signal, wherein the delay circuit is arranged between a first connection point of the enable signal line and the terminator circuit, and a second connection point of the enable signal line and an other terminator circuit.

11. The semiconductor storage device according to claim 4, wherein a signal transmission path reaching the terminator circuit from the control circuit includes
the enable signal line, and
a delay circuit configured to delay the enable signal.

12. A semiconductor storage device including:
a memory cell array in which a plurality of memory cells are aligned;
a pad to which data written to the memory cells is inputted;
a terminator circuit connected to the pad;
a driving circuit configured to be selectively brought into an enable state or a disable state based on an enable signal, and to drive the terminator circuit to a predetermined resistance value based on a resistance value control signal when the driving circuit is being brought into the enable state based on the enable signal; and
a control circuit configured to supply the enable signal and the resistance value control signal to the driving circuit, wherein
the semiconductor storage device includes a first end side and a second end side extending in a first direction, and a third end side and a fourth end side extending in a second direction orthogonal to the first direction,
the pad is arranged between the memory cell array and the first end side in the second direction,
the terminator circuit is arranged between the pad and the first end side in the second direction, and
the driving circuit is arranged between the terminator circuit and the first end side in the second direction.

13. A semiconductor storage device including:
a memory cell array in which a plurality of memory cells are aligned;
a pad to which data written to the memory cell array is inputted;
a terminator circuit connected to the pad;
a driving circuit configured to be selectively brought into an enable state or a disable state based on an enable signal, and to drive the terminator circuit to a predetermined resistance value based on a resistance value control signal when the driving circuit is being brought into the enable state based on the enable signal; and
a control circuit configured to supply the enable signal and the resistance value control signal to the driving circuit, wherein
the semiconductor storage device includes a first end side and a second end side extending in a first direction, and a third end side and a fourth end side extending in a second direction orthogonal to the first direction,
in the second direction, the pad is arranged in plurality between the memory cell array and the first end side in the first direction,
in the second direction, the terminator circuit is arranged in plurality between the pad and the first end side in the first direction,
in the second direction, the driving circuit is arranged in plurality between the terminator circuit and the first end side in the second direction in the first direction,
a resistance value control line extending in the first direction and transmitting the resistance value control signal and an enable signal line configured to transmit the enable signal are arranged between the driving circuit and the first end side in the second direction, and
the control circuit includes a decoder configured to transmit the resistance value control signal line to the plurality of the driving circuits.

\* \* \* \* \*